(12) United States Patent
You et al.

(10) Patent No.: US 9,896,378 B2
(45) Date of Patent: Feb. 20, 2018

(54) METHOD OF MANUFACTURING OPTICAL MEMBER

(71) Applicant: Samsung Display Co., Ltd., Yongin-Si, Gyeonggi-Do (KR)

(72) Inventors: Junwoo You, Seongnam-si (KR); Donghoon Kim, Suwon-si (KR); Taeho Lee, Seoul (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 37 days.

(21) Appl. No.: 15/097,336

(22) Filed: Apr. 13, 2016

(65) Prior Publication Data

US 2017/0044056 A1   Feb. 16, 2017

(30) Foreign Application Priority Data

Aug. 10, 2015   (KR) .................. 10-2015-0112580

(51) Int. Cl.
| | |
|---|---|
| *C03C 21/00* | (2006.01) |
| *C03C 23/00* | (2006.01) |
| *F21V 8/00* | (2006.01) |
| *H01J 37/317* | (2006.01) |

(52) U.S. Cl.
CPC ........ *C03C 21/005* (2013.01); *C03C 23/0055* (2013.01); *G02B 6/0003* (2013.01); *H01J 37/3171* (2013.01); *H01J 2237/31701* (2013.01); *Y10S 977/774* (2013.01); *Y10S 977/81* (2013.01); *Y10S 977/824* (2013.01); *Y10S 977/952* (2013.01)

(58) Field of Classification Search
CPC .............. C03C 21/005; C03C 23/0005; C03C 23/0055; H01J 37/3171; H01J 2237/31701
See application file for complete search history.

(56) References Cited

U.S. PATENT DOCUMENTS

| | | | |
|---|---|---|---|
| 2002/0190264 A1* | 12/2002 | Kim ................. | H01L 33/007 257/103 |
| 2012/0113672 A1 | 5/2012 | Dubrow et al. | |
| 2014/0334181 A1 | 11/2014 | Hu et al. | |

FOREIGN PATENT DOCUMENTS

| | | |
|---|---|---|
| JP | 2015-046328 A | 3/2015 |
| KR | 10-0729806 B1 | 6/2007 |
| KR | 1020100094194 A | 8/2010 |
| KR | 1020120018490 A | 3/2012 |
| KR | 1020120056001 A | 6/2012 |
| KR | 1020120088273 A | 8/2012 |
| KR | 1020140115924 A | 10/2014 |

* cited by examiner

*Primary Examiner* — Alison L Hindenlang
*Assistant Examiner* — Mohamed K Ahmed Ali
(74) *Attorney, Agent, or Firm* — Cantor Colburn LLP (57) ABSTRACT

A manufacturing method of an optical member includes providing a raw member, disposing first ions and second ions in the raw member, and heat-treating the raw member with the first and second ions therein such that the first ions are reacted with the second ions in the raw member to form quantum dots in the raw member which forms the optical member.

7 Claims, 9 Drawing Sheets

METHOD OF MANUFACTURING OPTICAL MEMBER

This application claims priority to Korean Patent Application No. 10-2015-0112580, filed on Aug. 10, 2015, and all the benefits accruing therefrom under 35 U.S.C. §119, the content of which in its entirety is herein incorporated by reference.

BACKGROUND

1. Field

The invention relates to a method of manufacturing an optical member. More particularly, the invention relates to a method of manufacturing an optical member including a quantum dot.

2. Description of the Related Art

In general, a liquid crystal display device is operated using optical anisotropy and polarization of liquid crystals. Since liquid crystal molecules have a relatively thin and long structure, the liquid crystal molecules have directivity while being arranged. The arrangement direction of the liquid crystal molecules is controlled by applying an electric field to the liquid crystals.

That is, when the arrangement of the liquid crystal molecules is changed by the electric field, a light is refracted to the arrangement direction of the liquid crystal molecules due to the optical anisotropy of the liquid crystal molecules, thereby displaying an image.

The liquid crystal display device is manufactured by including an array substrate manufacturing process in which a gate line, a data line, a thin film transistor and a pixel electrode are formed in an array substrate, a color filter substrate manufacturing process in which a black matrix, a color filter and a common electrode are formed in a color filter substrate, a cell process in which the array substrate and the color filter substrate are cut into the unit of a liquid crystal cell after the array substrate is coupled to the color filter substrate and then the liquid crystals are injected between the array substrate and the color filter substrate to form a unit panel, and a module process in which a driving integrated circuit ("IC") and a printed circuit board are attached to the unit panel and the unit panel is assembled with a backlight unit.

In particular, the backlight unit is included in the liquid crystal display since the liquid crystal molecules of the liquid crystal display device are not self-emissive. The backlight unit includes a light source which generates light and is classified into a direct-illumination type backlight unit and an edge-illumination type backlight unit.

As the light source, a fluorescent lamp, such as a cold cathode fluorescent lamp, an external electrode fluorescent lamp, etc., is widely used. However, the fluorescent lamp has widely been replaced with a light emitting diode since the light emitting diode has advantages of relatively low power consumption, light weight, high brightness, etc., when compared with the fluorescent lamp.

In the direct-illumination type backlight unit, lamps or light emitting diodes are disposed under a liquid crystal display panel of a liquid crystal display device, and thus the light generated and emitted from the lamps or the light emitting diodes is directly provided to the liquid crystal display panel. In the edge-illumination type backlight unit, a light guide plate is disposed under the liquid crystal display panel while the lamps or the light emitting diodes are disposed adjacent to one side surface of the light guide plate. In the edge-illumination type backlight unit, the light generated and emitted from the lamps or the light emitting diodes is provided to the liquid crystal display panel after being refracted and reflected by and passing through the light guide plate.

SUMMARY

One or more exemplary embodiment of the invention provides a method of manufacturing an optical member including a quantum dot.

Exemplary embodiments of the invention provide a manufacturing method of an optical member, including providing a raw member, disposing first ions and second ions in the raw member, and heat-treating the raw member with the first and second ions therein such that the first ions are reacted with the second ions in the raw member to form quantum dots in the raw member which forms the optical member.

According to the above, within a display device a light-converting function is incorporated into an optical member or sheet such that a colored light exiting from a light exit portion of a light-emitting unit may be converted to the white light even though there is no separate light-converting member as in a conventional display module. Accordingly, a cost for manufacturing equipment for the display device may be reduced and the white light conversion efficiency may be improved.

BRIEF DESCRIPTION OF THE DRAWINGS

The above and other advantages of the invention will become readily apparent by reference to the following detailed description when considered in conjunction with the accompanying drawings where.

DETAILED DESCRIPTION

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the invention will be explained in detail with reference to the accompanying drawings.

Figure 1A:
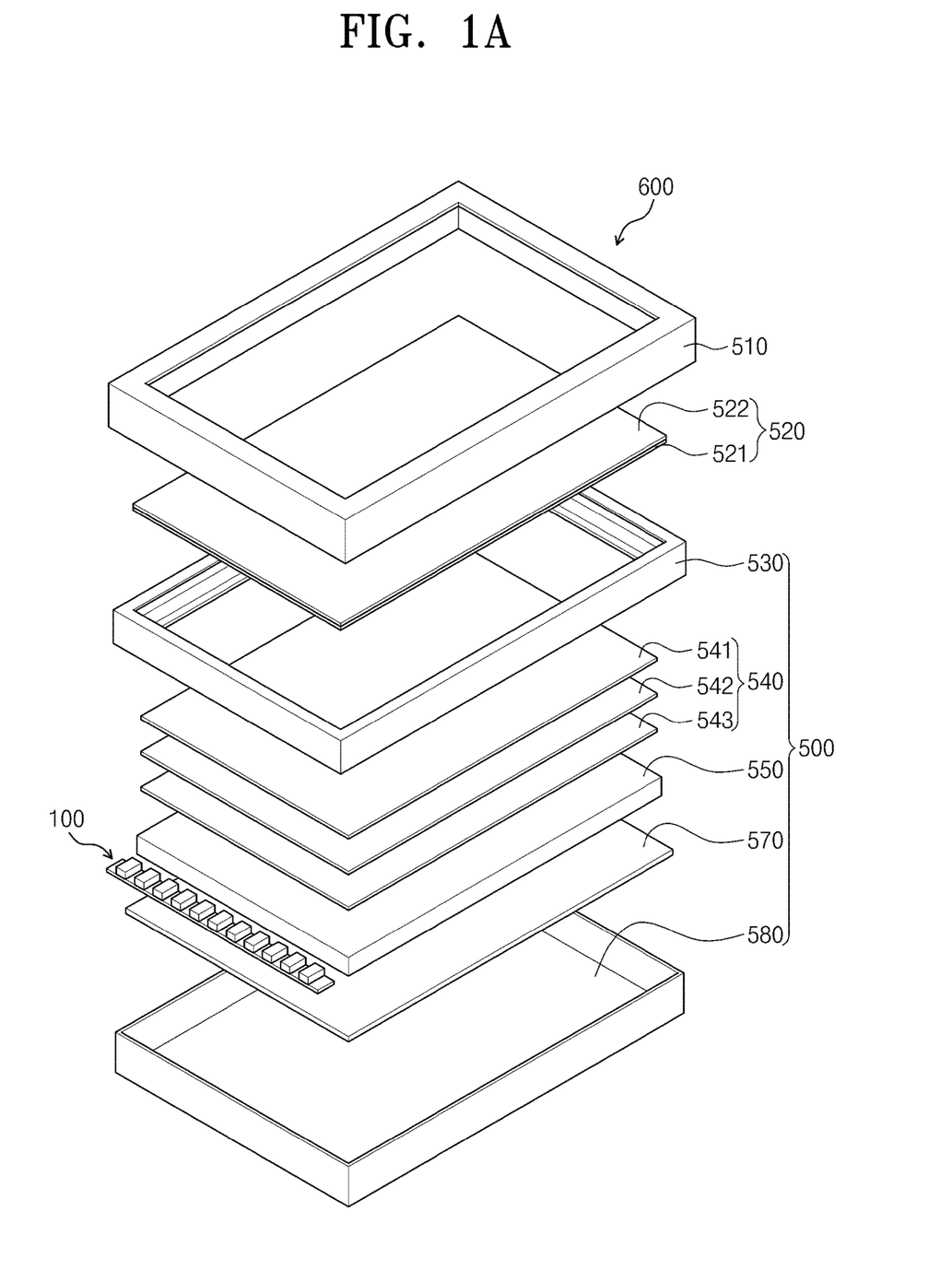
FIG. 1A is an exploded perspective view showing an exemplary embodiment of a display device including an optical member manufactured by a manufacturing method according to the invention.
Figure 1B:
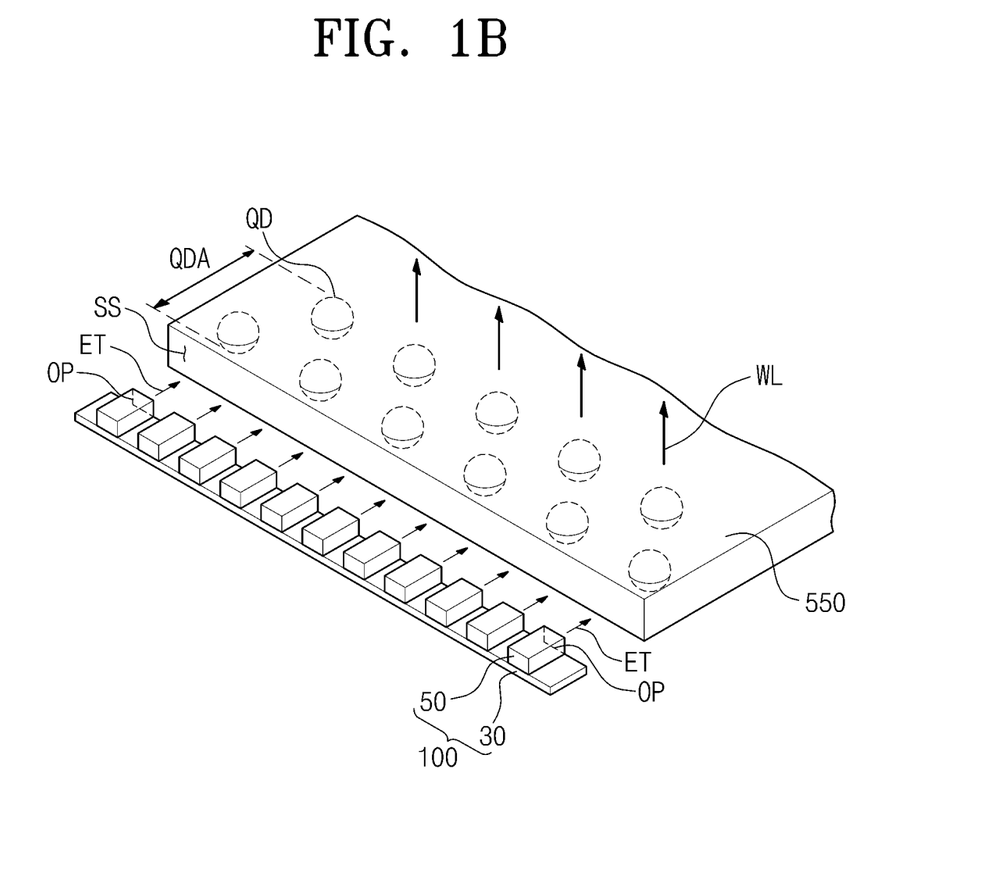
FIG. 1B is a perspective view showing an exemplary embodiment of a light emitting unit and a portion of a light guide plate of the display device shown in FIG. 1A.

FIG. 1A is an exploded perspective view showing an exemplary embodiment of a display device 600 including an optical member manufactured by a manufacturing method of an optical member according to the invention and FIG. 1B is a perspective view showing an exemplary embodiment of a light emitting unit 100 and a portion of a light guide plate 550 shown in FIG. 1A.

Referring to FIGS. 1A and 1B, the display device 600 includes a backlight assembly 500 and a display panel 520. The backlight assembly 500 generates and provides a light to the display panel 520 and the display panel 520 displays an image using the light.

The display panel 520 may be, but not limited to, a liquid crystal display panel. As a liquid crystal display panel, the display panel 520 includes a display substrate 521, an opposite substrate 522, and a liquid crystal layer (not shown) interposed between the display substrate 521 and the opposite substrate 522. The display substrate 521 includes a plurality of pixel electrodes (not shown) arranged in a plurality of pixel areas, respectively, and the opposite substrate 522 includes a common electrode (not shown) facing the pixel electrodes.

The display panel 520 should not be limited to the liquid crystal display panel. That is, various display panels, such as an electrophoretic display panel, an electrowetting display panel, etc., may be used as the display panel 520 according to exemplary embodiments.

In addition, the display panel 520 should not be limited to the above-mentioned structure. That is, the opposite substrate 522 does not include the common electrode, and the common electrode may be disposed in the display substrate 521 to be spaced apart from the pixel electrodes instead of being disposed in the opposite substrate 522.

The backlight assembly 500 includes a light emitting unit 100, an accommodating member 580, a reflective plate 570, the light guide plate 550, a mold frame 530, a plurality of sheets 540 and a cover member 510.

The light emitting unit 100 generates and emits the light. The light emitting unit 100 includes a printed circuit board 30 and a light emitting diode package 50 provided in plural. The light emitting diode packages 50 are mounted on the printed circuit board 30 and each of the light emitting diode packages 50 emits an exit light ET through a light exit portion (or surface) OP thereof, to the light guide plate 550 through a light exit portion OP.

The printed circuit board 30 is disposed adjacent to one side of the light guide plate 550 and lengthwise extends along a side surface SS of the light guide plate 550. In addition, the light exit portion OP, from which the exit light ET from each of the light emitting diode packages 50 exits, is disposed to face the side surface SS. The light emitting diode packages 50 mounted on the printed circuit board 30 are arranged along the side surface SS. Accordingly, the exit light ET is incident to the light guide plate 550 through the side surface SS.

The position and the number of the light emitting diode packages 50 arranged along the side surface SS should not be limited to the above-mentioned position and number. In an exemplary embodiment, for instance, the backlight assembly 500 may include first light emitting diode packages 50 arranged along a first side surface SS and second light emitting diode packages 50 arranged along a second side surface SS of the light guide plate 550 which is different from the first side surface thereof.

The light guide plate 550 has a substantially rectangular plate shape. The light guide plate 550 includes a material to guide the light from the light emitting unit 100 to the display panel 520. The material used to form the light guide plate 550 has a relatively high refractive index and is transparent. In the exemplary embodiment, the light guide plate 550 includes glass, but the invention is not limited thereto.

The light guide plate 550 may include quantum dots QD disposed at an inner area of the light guide plate 500, such as by being injected thereinto by one or more exemplary embodiment of the manufacturing method of an optical member described below. The quantum dots QD disposed at the inner area of the light guide plate 500 may be disposed in a body of the light guide plate 500, so as to be completely within the body of the light guide plate 550, as indicated by the dotted line shapes of the quantum dots QD in FIG. 1B. In an exemplary embodiment, the quantum dots QD may not be exposed to outside the body of the light guide plate 550. The quantum dots QD are provided in a quantum dot area QDA of the light guide plate 550. The quantum dot area QDA includes the side surface SS of the light guide plate 550 along which the light emitting diode packages 50 are arranged and corresponds to an area between the side surface SS and a position spaced apart from the side surface SS by a predetermined distance.

The exit light ET exiting from the light exit portion OP may be, but not limited to, a blue light. The exit light ET may be converted to a white light WL by the quantum dots QD in the quantum dot area QDA of the light guide plate 550. The light guide plate 550 guides the white light WL generated therein to allow the white light WL to travel in a direction perpendicular to a plane of the light guide plate 550, and the white light WL exits from the light guide plate 550 to form a surface light source shape toward the display panel 520.

The accommodating member 580 accommodates the light emitting unit 100, the reflective plate 570 and the light guide plate 550 therein.

The reflective plate 570 includes a material, e.g., polyethylene terephthalate ("PET"), aluminum, etc., to reflect the light and is disposed between a bottom portion of the accommodating member 580 and the light guide plate 550. Portions of the mold frame 530 respectively lengthwise extend along sidewalls of the accommodating member 580 and are coupled to the accommodating member 580. In addition, the mold frame 530 fixes edges of the light guide plate 550 accommodated in the accommodating member 580 to the bottom portion of the accommodating member 580. The sheets 540 and the display panel 520 are sequentially disposed on the mold frame 530.

The sheets 540 are disposed between the display panel 520 and the light guide plate 550. The sheets 540 include a diffusion sheet 543 diffusing the light which exits from the light guide plate 550, a prism sheet 542 condensing the diffused light to improve a front brightness of the display panel 520, and a protective sheet 541 protecting a rear surface of the display panel 520. The display panel 520 includes a display are at which an image is displayed and a non-display area at which the image is not displayed. The cover member 510 covers an edge of the display panel 520 to allow the display area of the display panel 520 disposed inside the edge to be exposed to the outside. The edge of the display panel 520 may include or correspond to the non-display area thereof.

The backlight assembly 500 should not be limited to the above-mentioned structure. In an exemplary embodiment where the reflective plate 570 as a separate member from the accommodating member 580 is omitted from the backlight assembly 500, a reflective coating layer may instead be coated on the bottom portion of the accommodating member 580.

One or more exemplary embodiment of the optical member according to the invention may be at least one of the sheets 540, the light guide plate 550 and the reflective plate 570 of the display device 600. In the exemplary embodiment, a manufacturing method of the light guide plate 550 as the optical member will be described in detail as a representative example.

Figure 2:
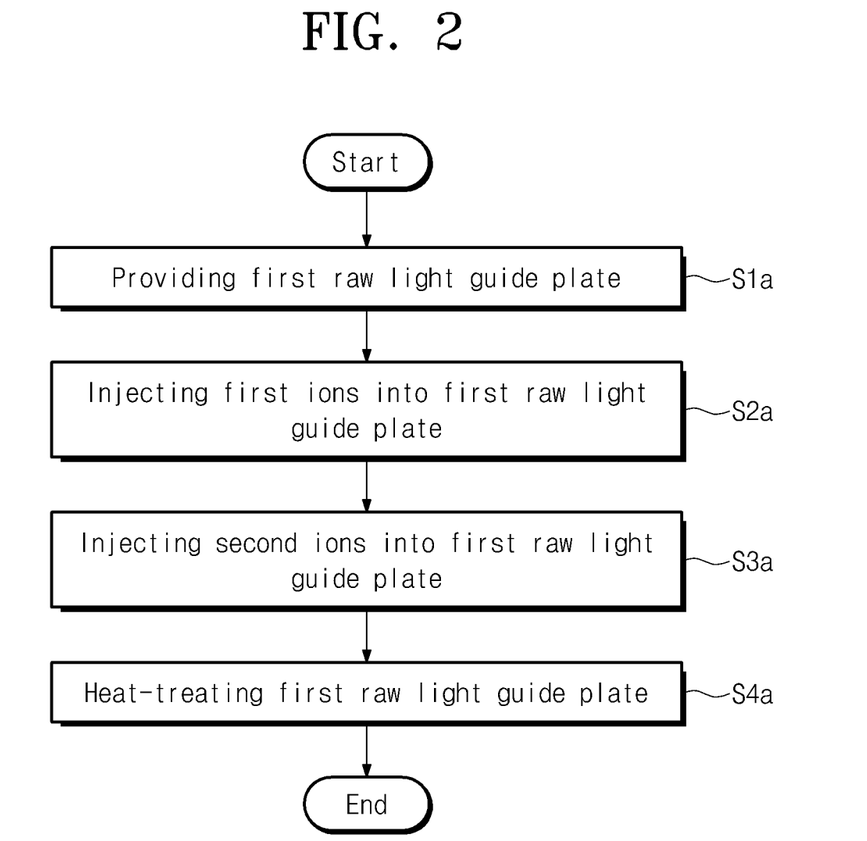
FIG. 2 is a flowchart showing an exemplary embodiment of a method of manufacturing an optical member according to the invention.
Figure 3A:
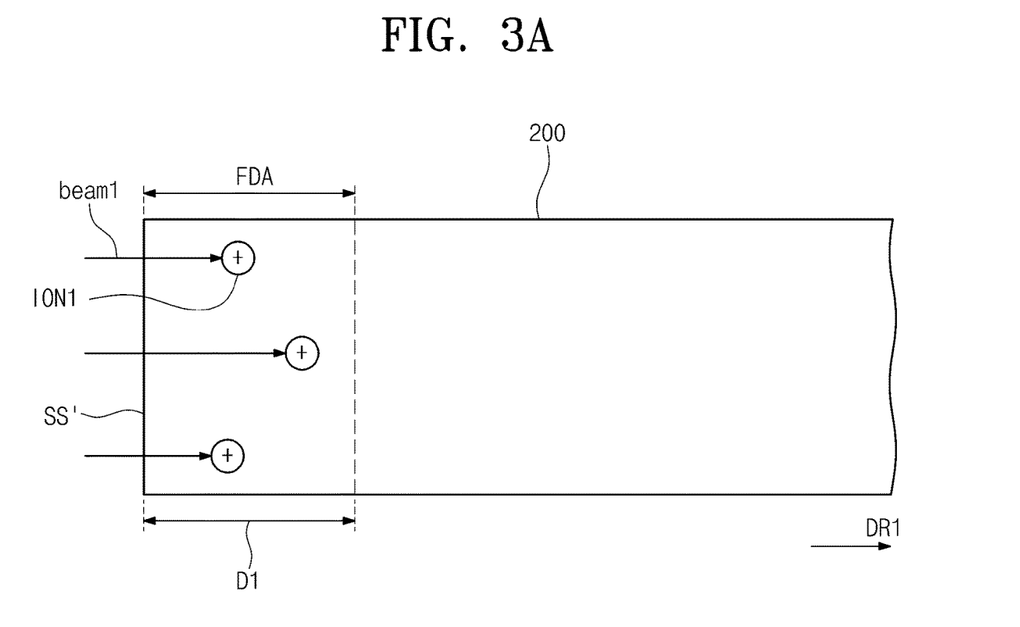
FIG. 3A is a cross-sectional view showing an exemplary embodiment of a process in which a first ion is injected into a first raw light guide plate, according to the method in FIG. 2.
Figure 3B:
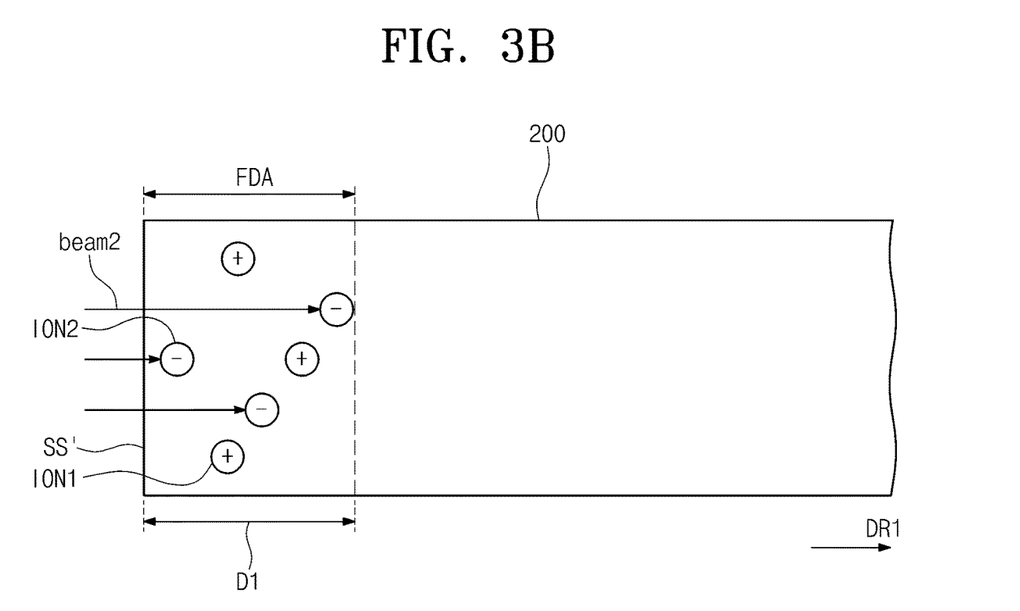
FIG. 3B is a cross-sectional view showing an exemplary embodiment of a process in which a second ion is injected into the first raw light guide plate, according to the method in FIG. 2.
Figure 3C:
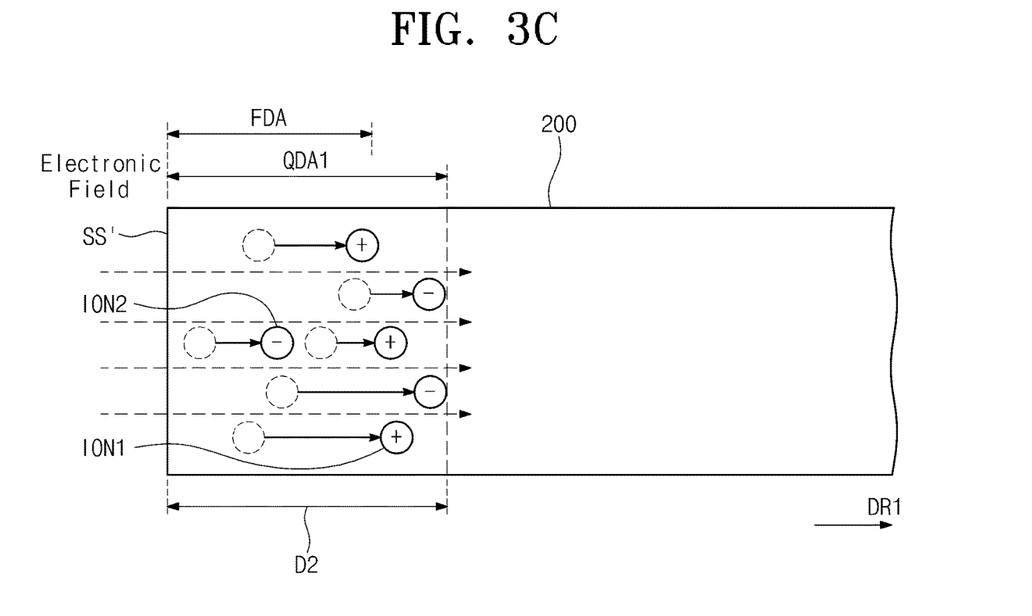
FIG. 3C is a view showing an exemplary embodiment of a process of applying an electric field to a first raw light guide plate, according to the method in FIG. 2.
Figure 3D:
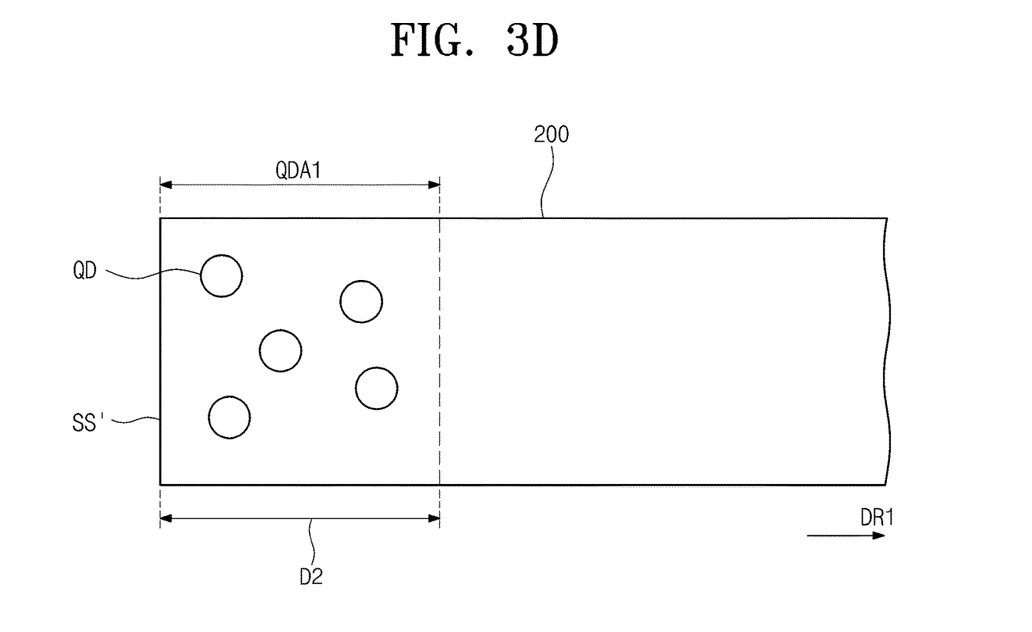
FIG. 3D is a cross-sectional view showing an exemplary embodiment of a first raw light guide plate which is heat treated according to the method in FIG. 2.

FIG. 2 is a flowchart showing an exemplary embodiment of a method of manufacturing an optical member according to the invention, FIG. 3A is a cross-sectional view showing an exemplary embodiment of a process in which when first ions ION1 are injected into a first raw light guide plate 200 according to the method in FIG. 2, FIG. 3B is a cross-sectional view showing an exemplary embodiment of a process in which second ions ION2 are injected into the first raw light guide plate 200 according to the method in FIG. 2, FIG. 3C is a view showing an exemplary embodiment of a process of applying an electric field to a first raw light guide plate, according to the method in FIG. 2, and FIG. 3D is a cross-sectional view showing an exemplary embodiment of a first raw light guide plate 200 which is heat treated according to the method in FIG. 2.

Referring to FIGS. 2 and 3A, the first raw light guide plate 200 (otherwise referred to as a "raw member") is provided (S1a). The first raw light guide plate 200 may have substantially the same shape as that of the light guide plate 550 described with reference to FIG. 1. However, the first raw light guide plate 200 may correspond to a form of the light guide plate 550 to which the quantum dots QD are not yet provided. As an example, the first raw light guide plate 200 may include glass.

Positive ions are injected into the first raw light guide plate 200 (S2a). Hereinafter, the positive ions are referred to as the first ions ION1.

The first ions ION1 may be the positive ions. As an example, the first ions ION1 include at least one of cadmium ions, zinc ions, phosphorus ions, gallium ions, lead ions, titanium ions and silver ions.

In the exemplary embodiment, the first ions ION1 may be injected into the first raw light guide plate 200 by an ion implantation process.

As shown in FIG. 3A, the first ions ION1 are injected into the first raw light guide plate 200 by a first ion beam beam1. In more detail, the first ion beam beam1 may be an ion beam formed by accelerating the first ions ION1. The first ion beam beam1 may be accelerated to about 10 kiloelectronvolts (keV) or more. The first ion beam beam1 is irradiated onto a side surface SS' of the first raw light guide plate 200 and may pass through the side surface SS' of the first raw light guide plate 200.

The first ions ION1 are provided to a light incident area FDA of the first raw light guide plate 200 and are not provided to a remaining area of the first raw light guide plate 200 except for the light incident area FDA thereof That is, the first ions ION1 are provided only to the light incident area FDA of the first raw light guide plate 200. The light incident area FDA and the remaining area of the first raw light guide plate 200 may define an entire of the first raw light guide plate 200.

The light incident area FDA is defined between the side surface SS' of the first raw light guide plate 200 and a position spaced apart from the side surface SS' by a first distance D1 in a direction DR1 substantially vertical (e.g., perpendicular) to the side surface SS' of the first raw light guide plate 200. A planar area of the light incident area FDA is defined by a length of the side surface SS' and the first distance D1.

Referring to FIG. 3B, negative ions are injected into the first raw light guide plate 200 (S3*a*). Hereinafter, the negative ions are referred to as second ions ION2. The injection of positive and negative ions may be performed in order of positive then negative ions or negative then positive ions, or may be simultaneously performed.

The second ions ION2 may be the negative ions. As an example, the second ions ION2 include at least one of sulfur ions, selenium ions, tellurium ions, bromide ions and iodide ions.

As shown in FIG. 3B, the second ions ION2 are injected into the first raw light guide plate 200 by a second ion beam beam2. In more detail, the second ion beam beam2 may be an ion beam formed by accelerating the second ions ION2. The second ion beam beam2 may be accelerated to about 10 keV or more. The second ion beam beam2 is irradiated onto the side surface SS' of the first raw light guide plate 200 and may pass through the side surface SS' of the first raw light guide plate 200.

The second ions ION2 are provided to the light incident area FDA of the first raw light guide plate 200 and not provided to a remaining area of the first raw light guide plate 200 except for the light incident area FDA thereof That is, the second ions ION2 are provided only to the light incident area FDA of the first raw light guide plate 200.

In the light incident area FDA, the first and second ions ION1 and ION2 are not coupled to each other and are uniformly distributed. In addition, the first and second ions ION1 and ION2 are spaced apart from each other by an ion separation distance. Initial positions of the first and second ions ION1 and ION2 as a result of the injection thereof into the first raw light guide plate 200 are indicated by the dotted line circles in FIG. 3C.

After the first and second ions ION1 and ION2 are injected into the light incident area FDA of the first raw light guide plate 200, an electric field is applied to the light incident area FDA such that the first and second ions ION1 and ION2 are scattered from respective initial positions thereof in the first raw light guide plate 200, along the first direction as shown in FIG. 3C. Since the first ions ION1 have a different polarity from that of the second ions ION2, a direction of the electric field applied to the first ions ION1 may be different from a direction of the electric field applied to the second ions ION2.

The electric field has variable intensity. For instance, as the intensity of the electric field increases, the scattering distance of the first and second ions ION1 and ION2 is enhanced (e.g., increases). In addition, a time, during which the electric field is applied to the light incident area FDA, is variable. For instance, as the time, during which the electric field is applied to the light incident area FDA increases, the scattering distance of the first and second ions ION1 and ION2 is enhanced (e.g., increases).

After the first and second ions ION1 and ION2 are scattered by the electric field, an area of the first raw light guide plate 200, in which the scattered first and second ions ION1 and ION2 are disposed, may be referred to as a first quantum dot area QDA1. The first quantum dot area QDA1 is defined between the side surface SS' of the first raw light guide plate 200 and a position spaced apart from the side surface SS' by a second distance D2 in the direction DR1. A planar area of first quantum dot area QDA1 is defined by a length of the side surface SS' and the second distance D2.

The second distance D2 may be larger than the first distance D1, taken from the side surface SS'. In other words, considering the planar areas described above, and a thickness of the first raw light guide plate 200, a volume of the first quantum dot area QDA1 may be greater than a volume of the light incident area FDA.

In general, the first and second ions ION1 and ION2 are scattered in the first direction DR1 away from the side surface SS' of the first raw light guide plate 200 by a distance of about 500 nanometers (nm) in response to the electric field applied thereto. Therefore, the first and second ions ION1 and ION2 may move in the first direction DR1 away from the side surface SS' by the distance of about 500 nm in response to the electric field. In an exemplary embodiment, the second distance D2 is larger than the first distance D1 owing to the scattering of the first and second ions ION1 and ION2. The second distance D2 may be about 500 nm taken in the first direction DR1 from the side surface SS'.

Referring to FIG. 3D, the first raw light guide plate 200 having the scattered first and second ions ION1 and ION2 therein is heat treated (S4*a*) such that the first and second ions ION1 and ION2 are coupled to each other within the first raw light guide plate 200 to form the quantum dots QD. A portion or an entire of the first raw light guide plate 200 may be heat treated to couple the first and second ions ION1 and ION2 to each other and form the quantum dots.

In an exemplary embodiment, for instance, where the first ions ION1 are the cadmium positive ion and the second ions ION2 are the sulfur negative ion, the first and second ions ION1 and ION2 form the quantum dots QD as a result of the heat treatment of the first raw light guide plate 200 having the scattered first and second ions ION1 and ION2 therein. Each of the quantum dots QD may include cadmium sulfide (CdS) formed from the cadmium positive ion and the sulfur negative ion.

In detail, the heat treatment is performed by heating the first raw light guide plate 200 having the scattered first and second ions ION1 and ION2 therein such as by using a heating apparatus provided outside the first raw light guide plate 200 having the scattered first and second ions ION1 and ION2 therein. Due to the heat treatment, a temperature of the first raw light guide plate 200 increases from an initial temperature thereof, to about 300 degrees Celsius to about 500 degrees Celsius.

When the temperature of the heated first raw light guide plate 200 is less than about 300 degrees Celsius, forming a core of the quantum dots QD may be difficult. In addition, when the temperature of the heated first raw light guide plate 200 exceeds about 500 degrees Celsius, a size of each quantum dot QD becomes larger than a specific or desired size, and thus the quantum dots QD at the larger size undesirably emits a light outside of a desired light region such as the visible light region. Thus, the temperature of the heated first raw light guide plate 200 is maintained in a range equal to or greater than about 300 degrees Celsius and less than about 500 degrees Celsius by the heat treatment process, and the first raw light guide plate 200 is heated during a time from about 10 hours to about 20 hours within such temperature range.

Due to the heat treatment process, the quantum dots QD, which have desired size and relatively high white light conversion efficiency, may be formed within the first raw light guide plate 200. Accordingly, the quantum dots QD are disposed or formed in the first quantum dot area QDA1, and as a result, the light guide plate 550 as an optical member according to the invention is completed. That is, referring to FIGS. 3D and 1B, the quantum dots QD of the first quantum dot area QDA1 of the first raw light guide plate 200 form the quantum dots QD in the quantum dot area QDA of the light guide plate 550.

Consequently, in one or more exemplary embodiment of the method of manufacturing an optical member according to the invention, when the positive and negative ions used as the material of the quantum dots QD are injected into the first raw light guide plate 200 and the quantum dots QD are formed in the first raw light guide plate 200, the quantum dots QD which convert the blue light exiting from the light exit portion OP of the emitting unit 100 to the white light WL which exits from the light guide plate 550 may be effectively provided in the light guide plate 550. Accordingly, a manufacturing cost and a manufacturing time of the light guide plate 550 may be reduced and a cost for manufacturing equipment may be reduced. In addition, since the quantum dots QD are concentrated in the quantum dot area QDA of the light guide plate 550 adjacent to the light exit portion OP, the white light conversion efficiency may be improved.

Figure 4:
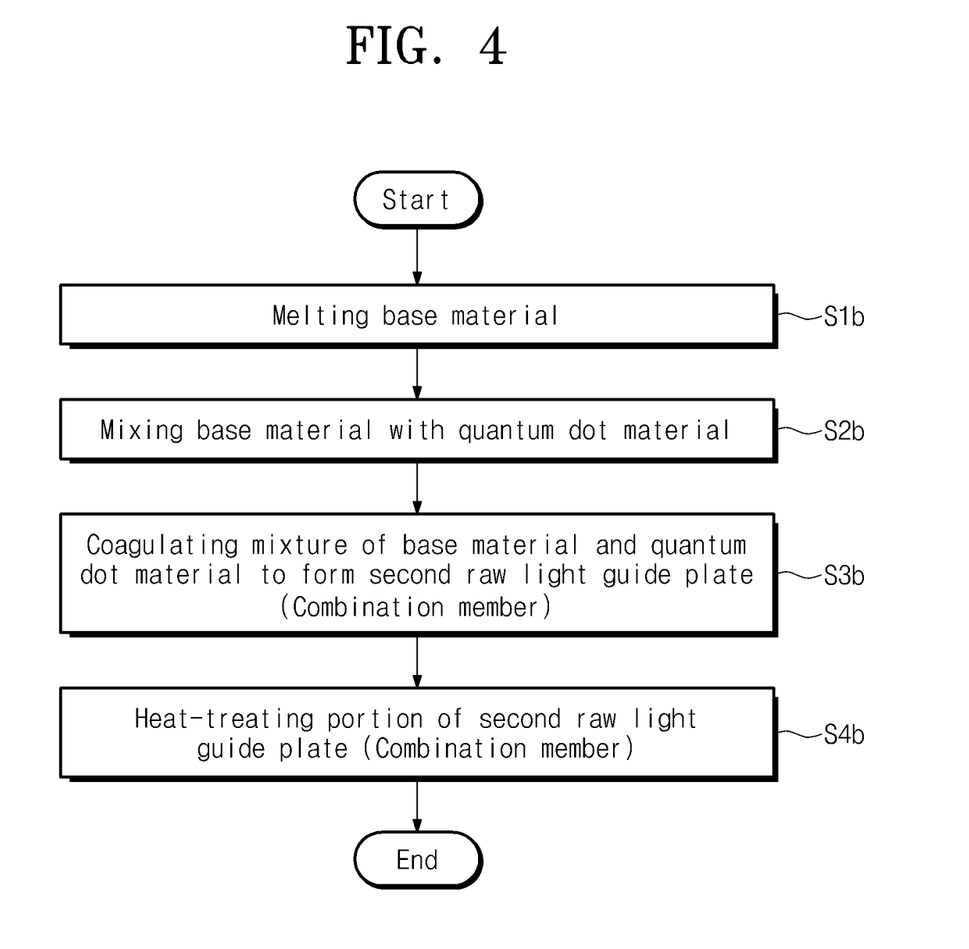
FIG. 4 is a flowchart showing another exemplary embodiment of a method of manufacturing an optical member according to the invention.
Figure 5A:
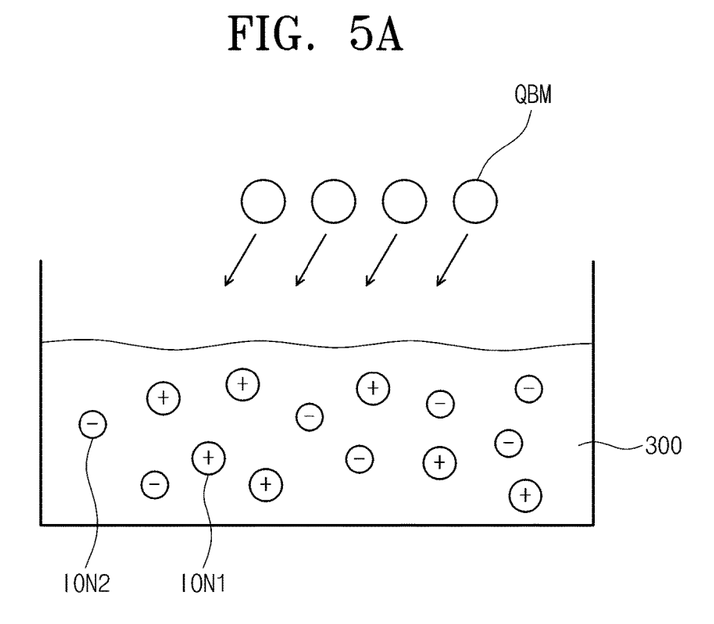
FIG. 5A is a cross-sectional view showing an exemplary embodiment of a process of mixing a quantum dot material with a base material according to the method in FIG. 4.
Figure 5B:
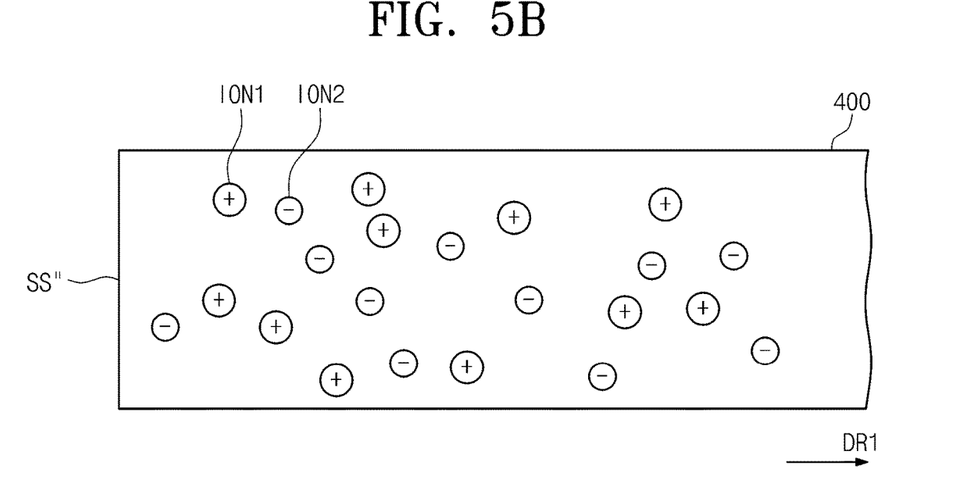
FIG. 5B is a cross-sectional view showing an exemplary embodiment of a second raw light guide plate formed according to the method in FIG. 4.
Figure 5C:
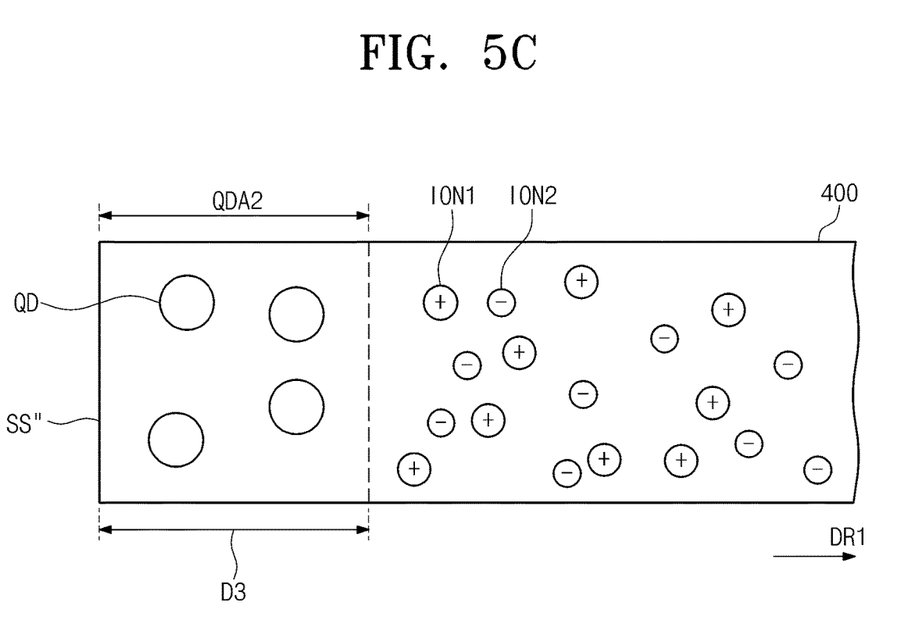
FIG. 5C is a cross-sectional view showing an exemplary embodiment of a second raw light guide plate which is heat treated according to the method in FIG. 4.

FIG. 4 is a flowchart showing another exemplary embodiment of a method of manufacturing an optical member according to the invention, FIG. 5A is a cross-sectional view showing an exemplary embodiment of a process of mixing a quantum dot material with a base material according to the method in FIG. 4, FIG. 5B is a cross-sectional view showing an exemplary embodiment of a second raw light guide plate formed according to the method in FIG. 4, and FIG. 5C is a cross-sectional view showing an exemplary embodiment of a second raw light guide plate which is heat treated according to the method in FIG. 4.

Referring to FIGS. 4 and 5A, a state of a base material 300 is changed such as being melted (S1b). The base material 300 may include glass. The base material 300 is melted at a temperature of about 1600 degrees Celsius or more. The melted base material 300 has fluidity which is different from an initial state thereof.

As shown in FIG. 5A, a quantum dot material QBM used to form the quantum dots QD of the optical member (refer to the light guide plate 550 in FIG. 1B) is provided to the melted base material 300 and mixed with the base material 300 such as in a molten state thereof (52b). The quantum dot material QBM may be an ion-binding material. In an exemplary embodiment, for instance, the quantum dot material QBM may include CdSe, CdTe, CdS, ZnSe, ZnTe, ZnS, InP, GaP, GaInP2, PbS, ZnO, TiO2, AgI or AgBr. The quantum dot material QBM may be in a solid state, but the invention is not limited thereto.

An initial state of the quantum dot material QBM added to the melted base material 300 may be changed such as by being melted. The quantum dot material QBM is degraded into the first ions ION1 which are positive ions, and the second ions ION2 which are negative ions, while the quantum dot material QBM in the melted base material 300 is being melted.

In an exemplary embodiment, for instance, when the quantum dot material QBM is cadmium sulfide (CdS), the cadmium sulfide (CdS) is added to the melted base material 300. The cadmium sulfide (CdS) is degraded into cadmium ions and sulfide ions in the melted base material 300 while by melting of the quantum dot material QBM.

Referring to FIG. 5B, the mixture obtained by combined melted base material 300 and the quantum dot material QBM is coagulated to form a second raw light guide plate 400 (otherwise referred to as a "combination member") (S3b). As an example, the mixture in the molten state may be cooled by a cooling apparatus.

The first and second ions ION1 and ION2 may be uniformly distributed in the second raw light guide plate 400. In an exemplary embodiment, for instance, the number of the first ions ION1 distributed in the second raw light guide plate 400 may be equal to the number of the second ions ION2 distributed in the second raw light guide plate 400.

The second raw light guide plate 400 may have substantially the same shape as that of the light guide plate 550 described with reference to FIG. 1. However, the second raw light guide plate 400 may correspond to the light guide plate 550 to which the quantum dots QD (refer to FIG. 1) are not yet provided.

Referring to FIG. 5C, a portion of the second raw light guide plate 400 having first and second ions ION1 and ION2 therein is heat treated (S4b). The heat treatment is performed by locally heating a second quantum dot area QDA2 of the second raw light guide plate 400. The second quantum dot area QDA2 is defined between a side surface SS" of the second raw light guide plate 400 and a position spaced apart from the side surface SS" by a third distance D3 in the direction DR1. In an exemplary embodiment the third distance D3 may be about 500 nm taken in the first direction DR1 from the side surface SS".

In more detail, only the second quantum dot area QDA2 of the second raw light guide plate 400 is heated and a remaining area of the second raw light guide plate 400 except for the second quantum dot area QDA2 is not heated. The second quantum dot area QDA2 and the remaining area of the second raw light guide plate 400 may define an entire of the second raw light guide plate 400. A planar area of the second quantum dot area QDA2 is defined by a length of the side surface SS" and the third distance D3.

When the second quantum dot area QDA2 is heat treated, the first and second ions ION1 and ION2 therein are coupled to each other, and thus the quantum dots QD are formed in the second quantum dot area QDA2. Since only the second quantum dot area QDA2 of the second raw light guide plate 400 is heated, the quantum dots QD are formed only in the second quantum dot area QDA2. The remaining area of the second raw light guide plate 400 except for the second quantum dot area QDA2 may include the un-heated first and second ions ION1 and ION2 which do not form quantum dots QD, but the invention is not limited thereto.

In an exemplary embodiment, for instance, where the first ions ION1 are the cadmium positive ion and the second ions ION2 are the sulfur negative ion, the locally heated first and second ions ION1 and ION2 form quantum dots QD in the local area to which heat is applied. Each of the quantum dots QD may include cadmium sulfide (CdS) formed from the cadmium positive ion and the sulfur negative ion.

In detail, the heat treatment is performed by heating the second raw light guide plate 400 using a heating apparatus provided outside the second raw light guide plate 400. Due to the heat treatment, a temperature of the second raw light guide plate 400 increases from an initial temperature thereof, to about 300 degrees Celsius to about 500 degrees Celsius.

When the temperature of the second raw light guide plate 400 is less than about 300 degrees Celsius, forming a core of the quantum dots QD may be difficult. In addition, when the temperature of the heated second raw light guide plate 400 exceeds about 500 degrees Celsius, a size of each quantum dot QD becomes larger than a specific or desired size, and thus the quantum dots QD at the larger size undesirably emits the light outside of a desired light region such as the visible light region. Thus, the temperature of the heated second raw light guide plate 400 is maintained in a range equal to or greater than about 300 degrees Celsius and less than about 500 degrees Celsius by the heat treatment process, and the second raw light guide plate 400 is heated during a time from about 10 hours to about 20 hours within such a temperature range.

Due to the heat treatment process, the quantum dots QD, which have desired size and relatively high white light conversion efficiency, may be formed within the second raw light guide plate 400. Accordingly, the quantum dots QD are disposed or formed in the second quantum dot area QDA2, and as a result, the light guide plate 550 as an optical member according to the invention is completed. That is, referring to FIGS. 5C and 1B, the quantum dots QD of the second quantum dot area QDA2 of the second raw light guide plate 400 form the quantum dots QD in the quantum dot area QDA of the light guide plate 550.

Consequently, in one or more exemplary embodiment of the method of manufacturing an optical member according to the invention, a the light guide plate 550 is manufactured by the manufacturing method shown in FIG. 4 to include the quantum dots QD locally formed in the light guide plate 550, and thus the blue light exiting from the light exit portion OP of the light emitting unit 100 may be converted to the white light WL which exits from the light guide plate 550 even though the display device 600 excludes an additional light-converting member of a conventional display module. Accordingly, since light may still be converted while the additional light-converting member is omitted, a cost for manufacturing equipment may be reduced. In addition, since the quantum dots QD are concentrated in the second quantum dot area QDA2 adjacent to the light exit portion OP, the white light conversion efficiency may be improved.

Figure 6:
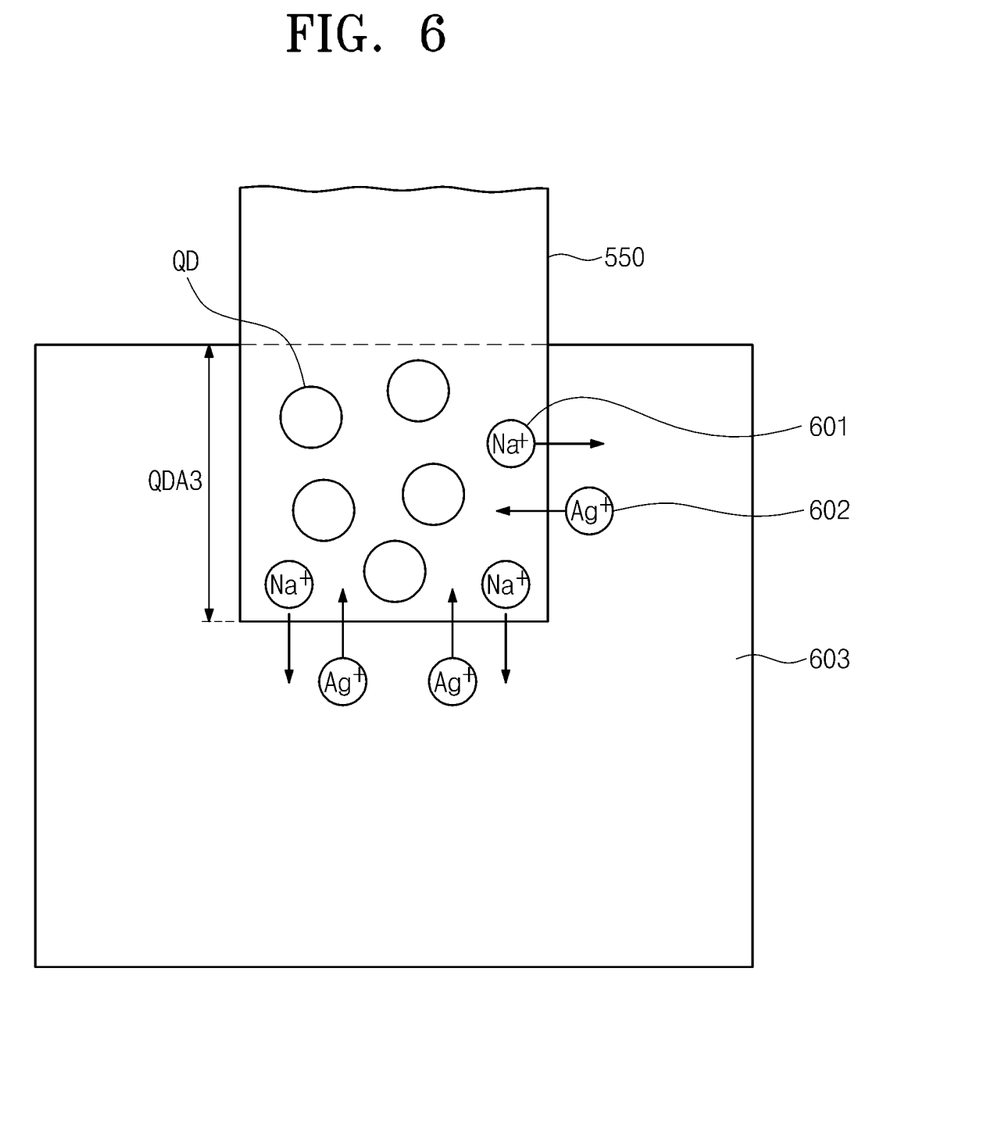
FIG. 6 is a view showing an exemplary embodiment of a process of ion exchange related to a raw light guide plate formed according to the invention.

FIG. 6 is a view showing an exemplary embodiment of a process of ion exchange related to a raw light guide plate formed according to the invention. By the ion exchange, functions of the quantum dots included in the optical member formed according to one or more exemplary embodiment of the invention may be further improved.

Referring to FIGS. 1 and 6, the light guide plate 550 including the quantum dots QD disposed or formed therein, as a form of the raw light guide plate, may make contact with an exchange liquid 603. In more detail, a portion of the light guide plate 550 which makes contact with the exchange liquid 603 may be an outer surface of the light guide plate 550 at the quantum dot area QDA. The outer surface of the light guide plate 550 which makes contact with the exchange liquid 603 may be defined at a quantum dot area length QDA3 of the light guide plate 550. Referring to FIGS. 1B, 3D and 5C, the length QDA3 may correspond to a length of the quantum dot areas FDA, QDA1 and QDA2.

The exchange liquid 603 includes second exchange positive ions 602 and second exchange negative ions (not shown). As an example, the exchange liquid 603 may be in the molten state. While ion exchange with respect to positive ions is described below, one of ordinary skill in the art would understand that such description is also generally applicable to negative ions (not shown).

When the exchange liquid 603 makes contact with the outer surface of the quantum dot area QDA of the light guide plate 550, an ion exchange occurs through the outer surface of the light guide plate 550 at the quantum dot area QDA. In the ion exchange through the outer surface of the light guide plate 550 at the quantum dot area QDA, the exchanged ions may include first exchange positive ions 601 initially distributed in an area of the quantum dot area QDA of the light guide plate 550 except an area occupied by the quantum dots QD, and the second exchange positive ions 602.

With the exchange liquid 603 in contact with the outer surface of the quantum dot area QDA of the light guide plate 550, the second exchange positive ions 602 move to within the quantum dot area QDA of the light guide plate 550 from the exchange liquid 603 outside the light guide plate 550, and the first exchange positive ions 601 move to the exchange liquid 603 from within the quantum dot area QDA of the light guide plate 550.

The second exchange positive ions 602 moved into the light guide plate 550 are provided in an area within a certain distance taken from each of the quantum dots QD. Where the second exchange positive ions 602 are provided within the light guide plate 550 at an area within a certain distance from each of the quantum dots QD, photoluminescence characteristics, e.g., self-emissive characteristics when being stimulated by the light, of the quantum dots QD may be improved. In more detail, the light emitting characteristics of each of the quantum dots QD may be improved by a surface plasmon generated on the first exchange positive ions 601 adjacent thereto.

In an exemplary embodiment, for instance, the second exchange positive ions 602 are silver ions and the second exchange negative ions are nitrate ions. The exchange liquid 603 is a silver nitrate molten liquid. The silver nitrate molten liquid is in a melted state by being heating at a temperature equal to or greater than about 250 degrees Celsius and equal to or less than about 300 degrees Celsius.

In addition, since the light guide plate 550 includes glass as described above, the first exchange positive ions 601 may be sodium (Na) ions.

Accordingly, the sodium (Na) ions of the light guide plate 550 may be exchanged with the silver (Ag) ions of the exchange liquid 603. The sodium (Na) ions move into the silver nitrate molten liquid from the light guide plate 550, which serves as the exchange liquid 603, and the silver (Ag) ions move into the light guide plate 550 from the exchange liquid 603.

The silver (Ag) ions moved into the light guide plate 550 are provided in an area within a certain distance from each of the quantum dots QD. As described above, each of the quantum dots QD may be cadmium sulfide (CdS), and the silver (Ag) ions moved in the light guide plate 550 may be provided in the area within a distance of about 30 nm taken from each of the cadmium sulfide (CdS) quantum dots QD. Where the silver (Ag) ions are provided in the area within a distance of about 30 nm taken from each of the cadmium sulfide (CdS) quantum dots QD, the photoluminescence characteristics of the cadmium sulfide (CdS) may be improved two times.

Consequently, formed from the raw light guide member, the light guide plate as an optical member according to the invention, which includes the quantum dots QD having the improved light emitting characteristics due to the exchange between the ions, may be manufactured.

Therefore, efficiency of converting the blue light emitted from the light exit portion OP of the light emitting unit 100 to the white light WL which exits from the light guide plate may be further improved by using the light guide plate including the quantum dots QD as an optical member according to the invention.

Although the exemplary embodiments of the invention have been described, it is understood that the invention should not be limited to these exemplary embodiments but various changes and modifications can be made by one ordinary skilled in the art within the spirit and scope of the invention as hereinafter claimed.

What is claimed is:

1. A method of manufacturing an optical member, comprising:
    providing a raw member injecting first ions and second ions into the raw member; and
    heat-treating the raw member having the first ions and second ions therein to couple the first ions to the second ions within a portion of the raw member, the coupled ions forming quantum dots within the portion of the raw member to form the optical member.

2. The method of claim 1, wherein the injecting the first and second ions into the raw member comprises:
    accelerating the first ions to form a first ion beam;
    accelerating the second ions to form a second ion beam;
    irradiating the first ion beam to the raw member to inject the first ions into the raw member; and
    irradiating the second ion beam to the raw member to inject the second ions into the raw member.

3. The method of claim 1, wherein the heat-treating the raw member is performed by heating the raw member at a temperature equal to or greater than about 300 degrees Celsius and equal to or less than about 500 degrees Celsius.

4. The method of claim 1, wherein
    the first and second ions are injected into the raw member through a side surface thereof corresponding to a light incident surface of the optical member, and
    the injected first and second ions are disposed within a first area portion of the raw member, the first area portion defined from the side surface of the raw member, and
    the injected first and second ions are not disposed within a second area portion of the raw member, the second area portion defined as a remaining area portion of the raw member except for the first area portion.

5. The method of claim 1, wherein the first and second ions are injected into the raw member through a side surface thereof corresponding to a light incident surface of the optical member,
    further comprising applying an electric field to the injected first and second ions to move the injected first and second ions within the portion of the raw member and in a first direction away from the side surface of the raw member.

6. The method of claim 1, wherein the raw member comprises a glass.

7. The method of claim 1, wherein the first ions have a polarity different from a polarity of the second ions.

* * * * *